United States Patent [19]

Nakamura et al.

[11] Patent Number: 5,661,332

[45] Date of Patent: Aug. 26, 1997

[54] SEMICONDUCTOR DIFFUSED RESISTOR

[75] Inventors: Katsumi Nakamura, Okazaki;
Tomohisa Yamamoto, Hoi-gun;
Hiroyuki Ban, Hazu-gun, all of Japan

[73] Assignee: Nippondenso Co., Ltd., Kariya, Japan

[21] Appl. No.: 378,273

[22] Filed: Jan. 26, 1995

[30] Foreign Application Priority Data

Jan. 27, 1994 [JP] Japan .................................. 6-007519

[51] Int. Cl.$^6$ ................................................ H01L 29/00
[52] U.S. Cl. ........................ 257/536; 257/532; 257/528;
257/539; 257/544; 257/773
[58] Field of Search ................................ 257/532, 536,
257/528, 741, 539, 544, 773

[56] References Cited

U.S. PATENT DOCUMENTS

| 4,001,869 | 1/1977 | Brown ....................... 257/532 |
| 5,111,068 | 5/1992 | Kusakabe ................. 257/536 |
| 5,315,149 | 5/1994 | Compagne ............... 257/536 |

FOREIGN PATENT DOCUMENTS

| 449028 | 10/1991 | European Pat. Off. . |
| 59-10255 | 1/1984 | Japan . |
| 61-172364 | 8/1986 | Japan . |
| 3272171 | 12/1991 | Japan . |

OTHER PUBLICATIONS

Otsuka et al: "Temperature Compensation Methods for Junction Isolated Analog Integrated Circuits and Their Applications", pp. 797–806, Dec. 1991.

*Primary Examiner*—Edward Wojciechowicz
*Attorney, Agent, or Firm*—Cushman, Darby & Cushman IP Group of Pillsbury Madison & Sutro LLP

[57] ABSTRACT

A diffused resistor capable of suppressing variation of characteristics caused by leakage of current occurring under high-temperature conditions. An N-type layer is epitaxially grown on a P-type substrate, and an N-type resistor island isolated by a P-type isolation region is formed. A P-type diffused resistor is formed in the island. An N-type region of high impurity concentration is disposed in close proximity to the high-potential end of the P-type diffused resistor. An electrode is brought into contact with not only the high-potential end but also the N-type high-impurity concentration region through the same contact hole. Thus, a parasitic transistor, which is formed from the P-type diffused resistor, the N-type resistor island and the P-type substrate (P-type isolation region), can be prevented from turning on with a minimal increase of the element area.

17 Claims, 5 Drawing Sheets

SEMICONDUCTOR DIFFUSED RESISTOR

CROSS REFERENCE TO RELATED APPLICATION

This application is based upon and claims the benefit of priority of the prior Japanese Patent application No. 6-7519 filed on Jan. 27, 1994, the contents of which are incorporated herein by reference.

BACKGROUND OF THE INVENTION

1. Field of the Invention

The present invention relates to semiconductor devices. More particularly, the present invention relates to a diffused resistor formed in a PN junction isolation type semiconductor device.

2. Related Arts

The most common type of resistive element that has heretofore been integrated in PN junction isolation type semiconductor devices is a P-type diffused resistor, which is formed by diffusing impurities, e.g., B (boron). That is, an $N^-$-type epitaxial layer is formed on a P-type semiconductor substrate, and a $P^+$-type isolation region is formed in the $N^-$-type epitaxial layer, and further a $P^+$-type region is formed in the $N^-$-type epitaxial layer, thereby forming a diffused resistor. Usually, the PN junction between the $P^+$-type resistor region and the $N^-$-type epitaxial layer is reverse-biased at all times. More specifically, the potential of the $N^-$-type epitaxial layer is set to the highest potential of the circuit, generally the power-supply voltage.

However, in a diffused resistor that is used in a circuit portion where a voltage higher than the power-supply voltage may be applied as an input voltage, the $N^-$-type epitaxial layer is connected nowhere and placed in a floating potential state. The reason for this is that, if the potential of the $N^-$-type epitaxial layer is set to the power-supply voltage as described above, when the voltage input to the resistor exceeds the power-supply voltage, the above-described PN junction is forward-biased, and a current flowing at this time causes breakage of a contact with wiring, e.g., aluminum wiring, or fusing of the wiring.

It is known that, when a diffused resistor is used under high-temperature environmental conditions where the temperature may exceed 100° C., current may leak from the epitaxial layer (N-type) to the substrate (P-type). In such a case, if the potential of the epitaxial layer has been set to the power-supply voltage, the leakage current is derived from the power supply. Accordingly, the leakage current has no effect on the current flowing through the resistor layer, and gives rise to no problem in practical use.

However, in a case where the epitaxial layer is placed in a floating potential state, that is, in a circuit configuration where a voltage higher than the power-supply voltage may be applied to the resistor, the current flowing through the resistor layer is drawn to form the above-described leakage current. Moreover, the leakage current may turn on a parasitic PNP transistor which is formed from the substrate, the epitaxial layer and the resistor layer. If the parasitic PNP transistor is activated, the amount of current drawn from the resistor layer is increased by the amplification factor of the transistor, causing the circuit characteristics to be disordered when the resistor layer is used as an input resistor for protecting a circuit element.

The leakage current may be reduced by providing an $N^+$-embedded region between the P-type substrate and the N-type epitaxial layer to thereby lower the amplification factor of the parasitic PNP transistor. With this technique, however, the amplification factor of the parasitic PNP transistor cannot satisfactorily be lowered.

SUMMARY OF THE INVENTION

Accordingly, an object of the present invention is to provide a semiconductor diffused resistor capable of suppressing variation of circuit characteristics caused by leakage of current occurring under high-temperature conditions.

To attain the above-described object, the present invention provides a semiconductor diffused resistor which is provided in a semiconductor circuit device and to which a potential higher than a power-supply voltage that is supplied to the semiconductor circuit device may be input. The semiconductor diffused resistor has a P-type diffused resistor region formed in an N-type semiconductor region that is isolated by a P-type semiconductor region. The potential of the N-type semiconductor region is set to the same level as that of the P-type diffused resistor region.

An N-type embedded region having a higher impurity concentration than that of the N-type semiconductor region may be formed between the N-type semiconductor region and the P-type semiconductor substrate.

The resistor may further have the following constituent elements: an N-type contact region formed on the surface of the N-type semiconductor region adjacently to the P-type diffused resistor region; an insulating film formed over the N-type semiconductor region; a contact hole for electrical contact with the P-type diffused resistor region; and a wiring layer connected to both the P-type diffused resistor region and the N-type contact region through the contact hole.

The N-type contact region is preferably formed so as to surround the periphery of the P-type diffused resistor region.

With the above-described arrangement, even when current leaks from the N-type semiconductor region to the P-type semiconductor substrate under high-temperature environmental conditions, since the N-type semiconductor region is set to the same potential as that of the high-potential end of the P-type diffused resistor region, there is no possibility that a parasitic PNP transistor formed from the P-type diffused resistor region, the N-type semiconductor region and the P-type semiconductor substrate will turn on. Thus, it is possible to suppress the amplification of current by the parasitic PNP transistor, and hence no considerable amount of current will be drawn from the P-type diffused resistor region. Accordingly, when the semiconductor diffused resistor is used as an input resistor for a circuit element, it is possible to prevent occurrence of circuit characteristic abnormalities, for example, a variation of the threshold value, output error, etc. Further, since the N-type semiconductor region and the P-type diffused resistor region can be set to the same potential, a contact hole can be used in common, and a contact can be formed without an increase in the element area.

In the semiconductor diffused resistor, even if the N-type semiconductor region and the P-type diffused resistor region are set to the same potential, since the N-type semiconductor region has a relatively high resistance, the potential at a region of the N-type semiconductor region which is in the neighborhood of the P-type substrate may drop in comparison to the potential at a region which is subjected to application of potential when leakage of current occurs at high temperatures. Therefore, there is a possibility that the potential drop will cause the parasitic transistor to turn on. However, this problem is solved by the presence of a low-resistance region between the N-type semiconductor region and the P-type semiconductor substrate, which is provided by forming an N-type impurity region having a higher impurity concentration than that of the N-type semiconductor region.

If the N-type contact region is formed so as to surround the P-type diffused resistor region, the N-type semiconductor region can be uniformly set to the given potential at the entire periphery of the P-type diffused resistor region. Thus, it is possible to prevent the parasitic PNP transistor from turning on even more effectively.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

Figure 1:
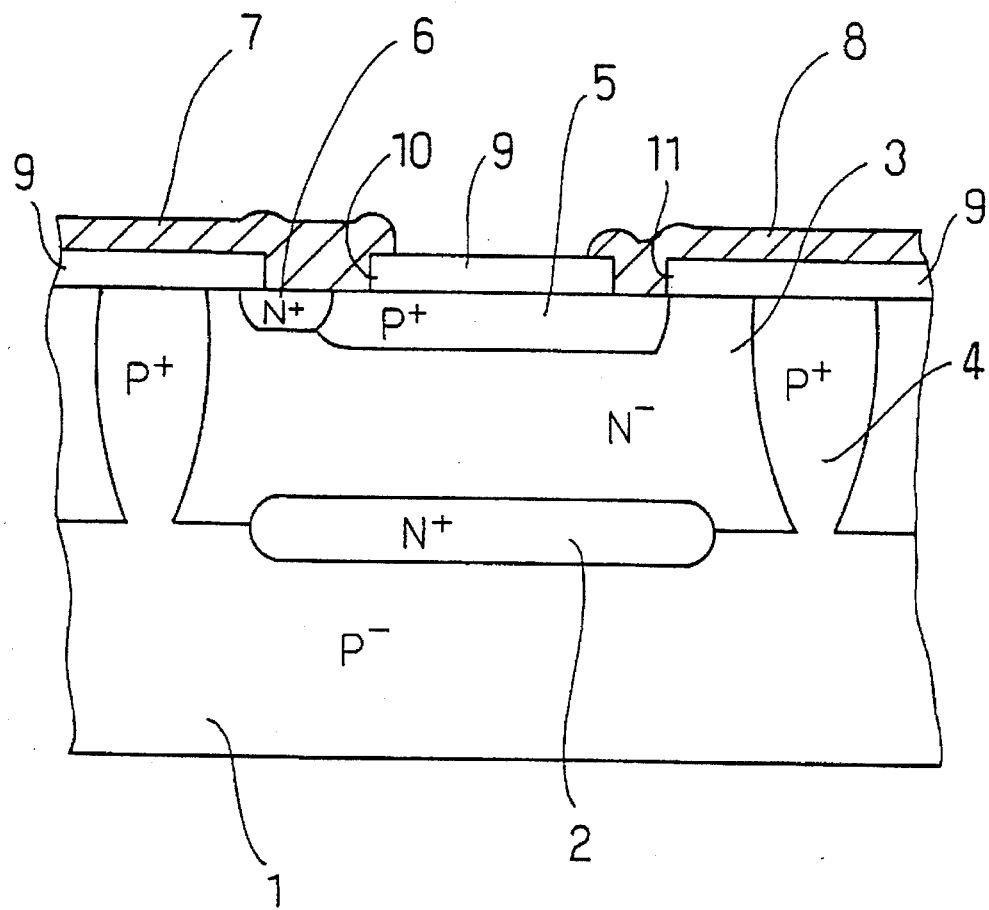
FIG. 1 is a sectional view of a diffused resistor according to a first embodiment of the present invention.

FIG. 1 shows a first embodiment of the present invention. In the figure, reference numeral 1 denotes a $P^-$-type silicon substrate, 2 an $N^+$-type embedded layer, 3 an $N^-$-type epitaxial layer, 4 a $P^+$-type isolation region, 5 a $P^+$-type diffused resistor, 6 an $N^+$-type contact region, 7 and 8 metal wiring films, 9 a field oxide film, and 10 and 11 contact holes.

Next, a method of forming the diffused resistor according to this embodiment will be briefly explained. First, N-type impurities are ion-implanted into a $P^-$-type silicon substrate 1 to form an $N^+$-type embedded layer 2. Thereafter, an $N^-$-type epitaxial layer 3 is epitaxially grown. Then, as is well known, a $P^+$-type isolation region 4 is formed, and an N-type semiconductor region (island) is formed from the $N^-$-type epitaxial layer 3. The N-type semiconductor region (island) is surrounded at the periphery and bottom thereof by the $P^+$-type isolation region 4 and the $P^-$-type substrate 1 and thus isolated from other regions (not shown) on the same substrate 1 to form a PN junction isolation structure. A $P^+$-type diffused resistor 5 and an $N^+$-type contact region 6 are formed on the surface of the N-type island 3 by using photo-lithography technique. Further, a field oxide film 9 is formed over the surface, and contact holes 10 and 1t are opened in the field oxide film 9. Then, wiring films 7 and 8 of aluminum or other metal are formed. It should be noted that the $N^+$-type contact region 6 needs to be set to the same potential as that of the high-potential end of the $P^+$-type diffused resistor 5 and is therefore connected to the wiring film 7 through the same contact hole 10.

If the arrangement is such that the $N^+$-type contact region 6 is not placed adjacently to the $P^+$-type diffused resistor 5 unlike the arrangement shown in FIG. 1, and another contact hole is provided exclusively for the $N^+$-type contact region 6, the island region (N-type region) cannot be formed as a region having a minimal element area. In this embodiment, the $N^+$-type contact region 6 is disposed adjacently to the $P^+$-type diffused resistor 5, and the diffused resistor 5 and the contact region 6 are allowed to use one contact hole in common, thereby enabling the element area to be advantageously reduced.

Figure 2:
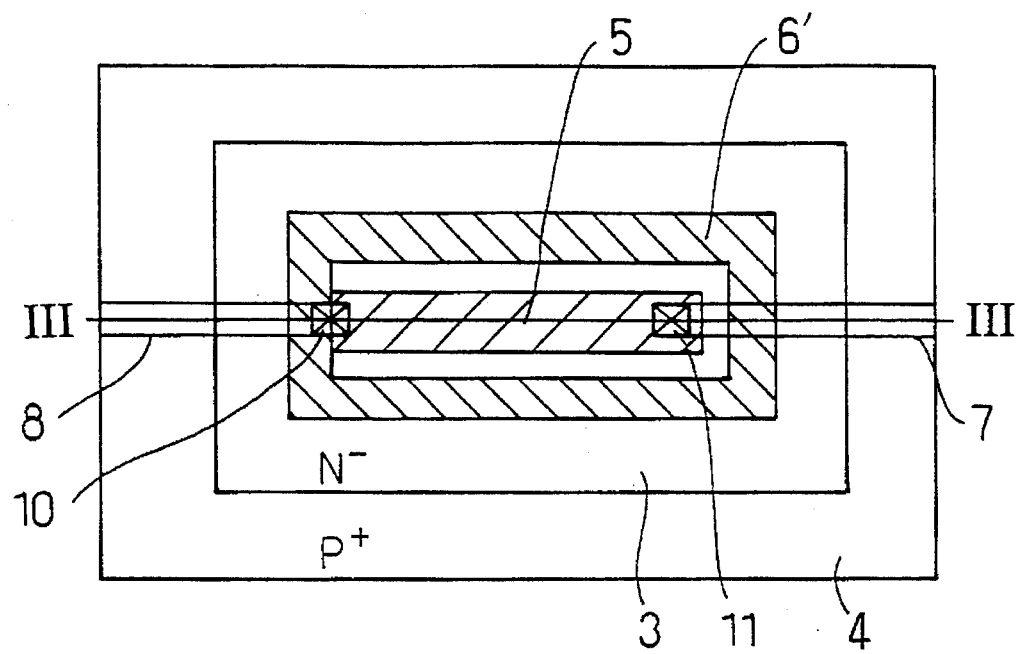
FIG. 2 is a plan view of a diffused resistor according to a second embodiment of the present invention.
Figure 3:
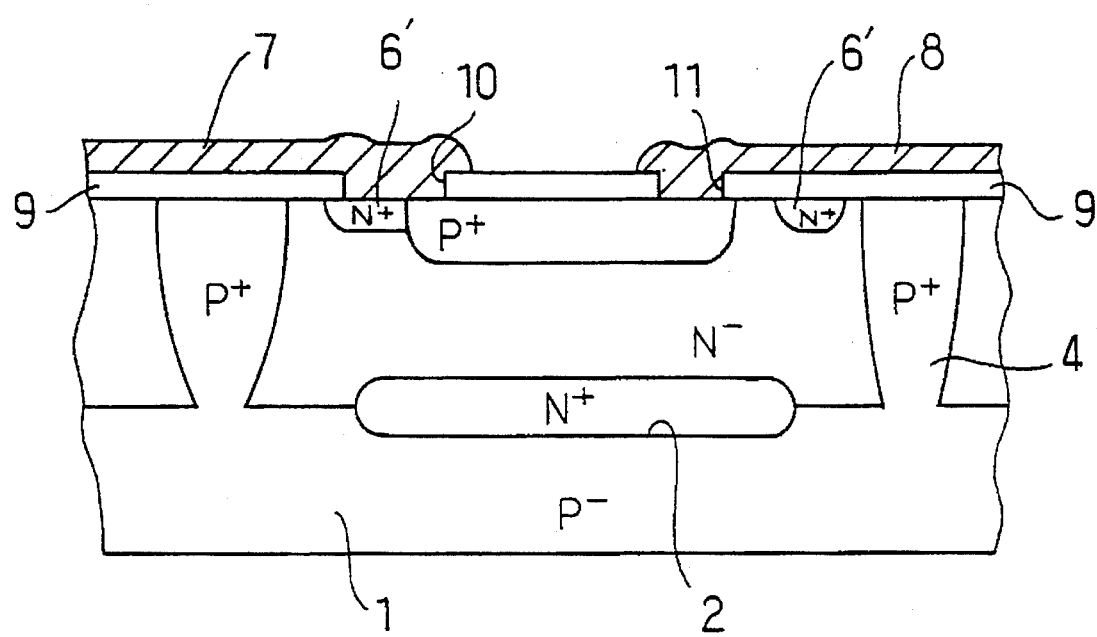
FIG. 3 is a sectional view taken along the line III—III in FIG. 2.

FIG. 2 is a plan view showing a second embodiment of the present invention. FIG. 3 is a sectional view taken along the line III—III in FIG. 2. In the second embodiment, an $N^+$-type contact region 6' is formed so as to surround the periphery of the $P^+$-type diffused resistor 5. With this arrangement, the $N^-$-type epitaxial layer 3 around the $P^+$-type diffused resistor 5 is entirely set to the potential at the high-potential end. Therefore, the parasitic PNP transistor can be prevented from turning on at the entire periphery of the $P^+$-type diffused resistor 5. It should be noted that the $N^+$-type contact region 6' may be either in or out of contact with the $P^+$-type diffused resistor 5 at the entire periphery of the $P^+$-type diffused resistor 5.

Figure 4:
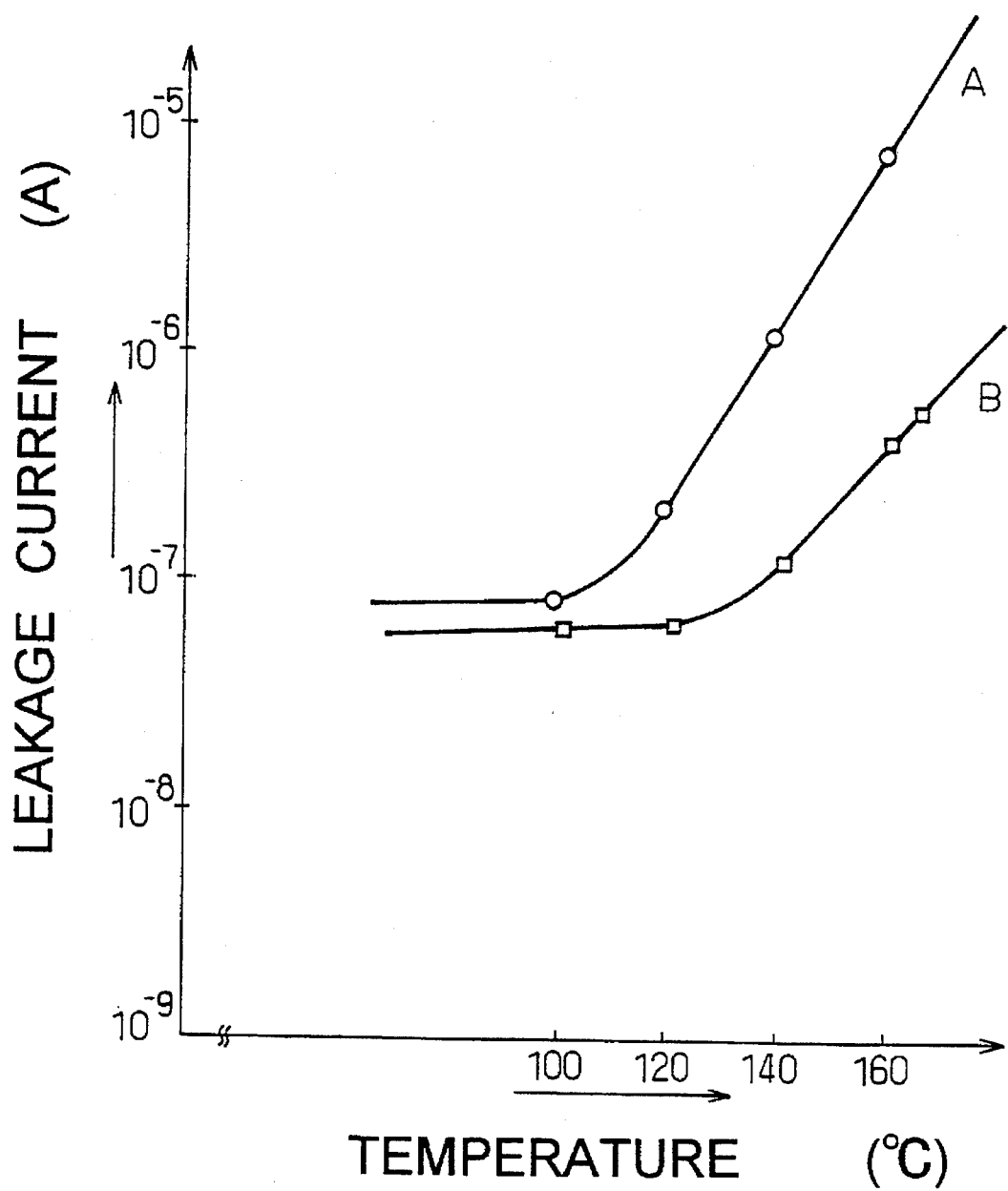
FIG. 4 is a graph showing the relationship between leakage current and working environmental conditions (temperature)

FIG. 4 is a graph showing the relationship between working temperatures at which semiconductor diffused resistors are used and leakage currents at the corresponding working temperatures. In the graph, the curve A represents the characteristics of a conventional resistor in which the $N^-$-type epitaxial layer is placed in a floating state, and the curve B represents the characteristics of a resistor according to the present invention. As will be understood from the graph, in the conventional resistor the leakage current begins to increase rapidly when the temperature exceeds 100° C. In contrast, in the resistor of the present invention, since the $N^-$-type epitaxial layer 3 and the $P^+$-type diffused resistor 5 are set to the same potential, no parasitic transistor turns on, and even when the current leaking at high temperatures is drawn from the $P^+$-type diffused resistor 5, no current amplifying action is performed by a parasitic transistor. Accordingly, the increase of the leakage current is suppressed.

Thus, the increase of the leakage current can be suppressed by setting the $P^+$-type diffused resistor 5 and the $N^-$-type epitaxial layer 3 to the same potential. However, the leakage current increase can be suppressed even more effectively by providing an $N^+$-type embedded layer 2 between the $N^-$-type epitaxial layer 3 and the $P^-$-type silicon substrate 1, as shown in FIGS. 1 and 3.

More specifically, even if the $P^+$-type diffused resistor 5 and the $N^-$-type epitaxial layer 3 are set to the same potential, since the $N^-$-type epitaxial layer 3 has a relatively high resistance, a potential drop occurs when leakage of current occurs at high temperatures, which may cause the parasitic transistor to turn on. However, the potential drop can be suppressed by providing the $N^+$-type embedded layer 2, and it is possible to prevent the parasitic transistor from turning on.

Figure 5:
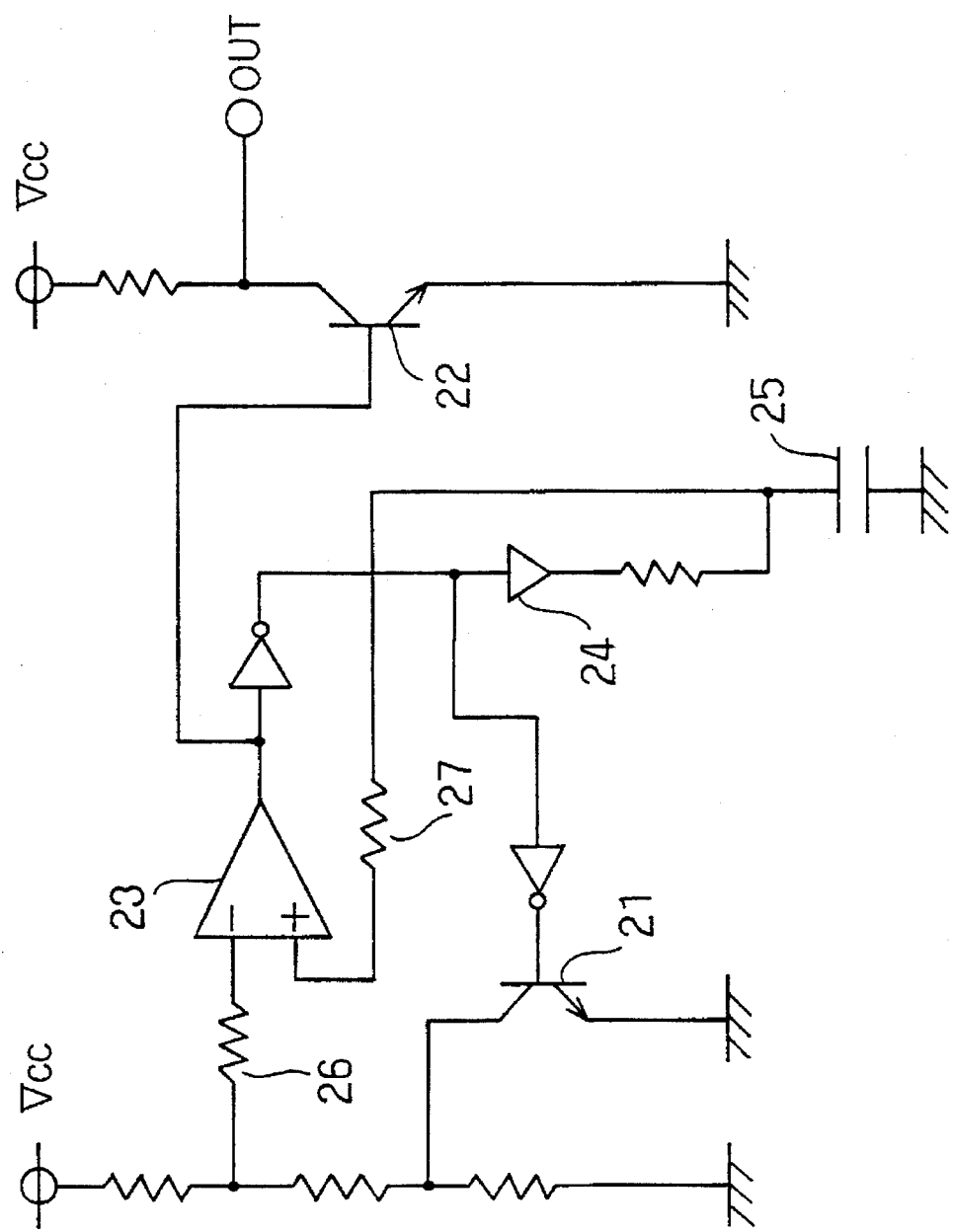
FIG. 5 is a diagram showing a circuit using a semiconductor diffused resistor according to the present invention.

FIG. 5 is a circuit diagram showing an output circuit using a comparator. The illustrated circuit is used to output, for example, a flashing signal for a direction indicator of a vehicle. That is, a transistor 22 is turned on/off in response to an output from a comparator 23, thereby outputting a flashing signal from an output terminal OUT. The circuit operation will be briefly explained below. A capacitor 25 is charged through a buffer 24, and when the plus input of the comparator 23 exceeds a threshold value, the output of the comparator 23 becomes high. Consequently, the operating mode of the capacitor 25 changes to the discharge mode, and the capacitor 25 begins to discharge through the buffer 24. At the same time, a transistor 21 turns on, causing the threshold value of the comparator 23 to lower. When the plus input of the comparator 23 becomes lower than the threshold value thereof as a result of the drop of potential of the capacitor 25 due to the discharge of it, the output of the comparator 23 becomes low. Consequently, the operating mode of the capacitor 25 changes to the charge mode, and at the same time, the transistor 21 turns off, causing the threshold value to rise. By repeating this cycle, a flashing signal is output.

In this circuit, if input resistors 26 and 27 for the comparator 23 are each formed by using a conventional semiconductor diffused resistor in which the N⁻-type epitaxial layer is placed in a floating potential state, when the working temperature becomes high, i.e., 100° C. or higher, current leakage occurs, as described above, and when the value of the leakage current is large, various problems arise: The threshold value varies; the discharge timing of the capacitor 25 is advanced; the potential of the plus input of the comparator 23 becomes lower than the potential of the capacitor 25; etc. As a result, the flashing period varies undesirably. However, when the input resistors 26 and 27 are each formed by using a semiconductor diffused resistor of the present invention, the leakage current can be reduced, as described above. Therefore, variation of the flashing period can be suppressed.

Figure 6:
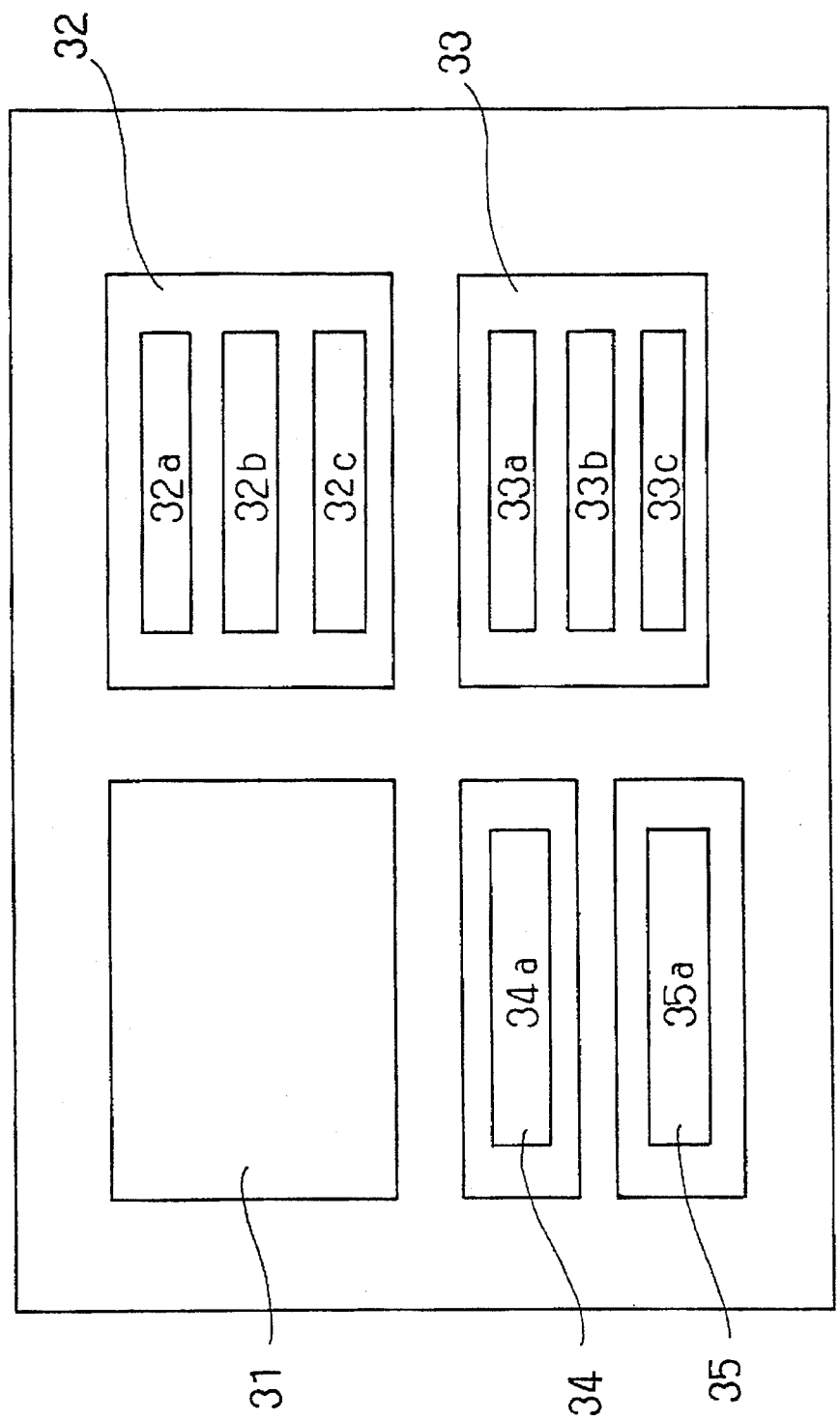
FIG. 6 shows one example of the pattern layout of a semiconductor device according to the present invention.

FIG. 6 shows one example of the pattern layout of a semiconductor device according to the present invention. In the figure, reference numeral 31 denotes an element region for transistors or other elements, and 32 denotes a resistor island in which are formed diffused resistors 32a, 32b and 32c each having an N⁻-type epitaxial layer set to a power-supply voltage. Reference numeral 33 denotes a resistor island in which are formed diffused resistors 33a, 33b and 33c each having an N⁻-type epitaxial layer set to a floating potential. Reference numerals 34 and 35 denote diffused resistor island regions according to the present invention, in which diffused resistors 34a and 35b are formed, respectively. Designing an element pattern layout in this way makes it possible to hold the increase of the element area to a minimum. That is, there is only an increase in area which is caused by the provision of the semiconductor diffused resistors of the present invention. It should be noted that it is preferable to set island regions 34 and 35 for respective diffused resistors of the present invention, as shown in FIG. 6. However, in a case where voltages which are applied to the respective high-potential ends of the resistors are equal to each other, the resistors can be disposed in the same island.

Although the present invention has been described through specific terms, it should be noted here that the described embodiments are not necessarily exclusive and that various changes and modifications may be imparted thereto without departing from the scope of the invention which is limited solely by the appended claims.

What is claimed is:

1. A resistor constituting a semiconductor circuit device, comprising:

a P-type semiconductor region;

an N-type semiconductor region surrounded at a bottom portion and at a peripheral portion thereof by said P-type semiconductor region;

a diffused resistor having a P-conductivity type, disposed in said N-type semiconductor region, said diffused resistor having a high-potential end and a low-potential end, said high-potential end being capable of receiving an input voltage which potentially exceeds a voltage of a power-supply for said semiconductor circuit device; and a contact region of N-conductivity type disposed in said N-type semiconductor region, said contact region being capable of receiving said input voltage to set a potential of said entire N-type semiconductor region to a same potential as that of said high-potential end of said diffused resistor.

2. The resistor according to claim 1, further comprising:

an N-type embedded region disposed between said bottom portion of said N-type semiconductor region and said P-type semiconductor region, said N-type embedded region having a higher impurity concentration than that of said N-type semiconductor region.

3. The resistor according to claim 1, wherein:

said high-potential end and said low-potential end of said diffused resistor are connected to a first wiring electrode and a second wiring electrode, respectively, said first wiring electrode also contacting said contact region.

4. The resistor according to claim 3, wherein:

said contact region is formed in a pattern surrounding said diffused resistor and is in contact with only said high-potential end of said diffused resistor.

5. The resistor according to claim 2, wherein:

said high-potential end and said low-potential end of said diffused resistor are connected to a first wiring electrode and a second wiring electrode, respectively, said first wiring electrode also contacting said contact region.

6. The resistor according to claim 5, wherein:

said contact region is formed in a pattern surrounding said diffused resistor and is in contact with only said high-potential end of said diffused resistor.

7. A resistor constituting a semiconductor circuit device, comprising:

a P-type semiconductor region;

an N-type semiconductor region surrounded at a bottom portion and at a peripheral portion thereof by said P-type semiconductor region;

a diffused resistor region formed of a P-type diffused region disposed on a surface of said N-type semiconductor region;

an insulating film covering said surface of said N-type semiconductor region and said diffused resistor region, said insulating film having a first contact hole which exposes a first end portion of said diffused resistor region, and a second contact hole which exposes a second end portion of said diffused resistor region;

a contact region of N-conductivity type disposed on said surface of said N-type semiconductor region so as to be in contact with both said first end portion of said diffused resistor region and said N-type semiconductor region, said contact region having a higher N-type impurity concentration than that of said N-type semiconductor region;

a first electrode film contacting both said first end portion of said diffused resistor region and said contact region through said first contact hole, for application of a high-potential thereto; and a second electrode film contacting said second end portion of said diffused resistor region through said second contact hole, for application of a low-potential thereto.

8. The resistor according to claim 7, further comprising:

an N-type embedded region disposed between said bottom portion of said N-type semiconductor region and said P-type semiconductor region, said N-type embedded region having a higher impurity concentration than that of said N-type semiconductor region.

9. The resistor according to claim 1, wherein:

said contact region is disposed within said N-type semiconductor region so as to be in contact with said high potential end of said diffused resistor.

10. The resistor according to claim 1, wherein:

said semiconductor circuit device includes a comparator; and said diffused resistor is used as an input resistor for an input terminal of said comparator.

11. The resistor according to claim 1, wherein:

said semiconductor circuit device is subject to an environmental condition in which a temperature exceeds 100° C.

12. The resistor according to claim 7, wherein:

said semiconductor circuit device includes a comparator; and said diffused resistor is used as an input resistor for an input terminal of said comparator.

13. The resistor according to claim 7, wherein:

said semiconductor circuit device is subject to environmental condition in which a temperature exceeds 100° C.

14. A resistor constituting a semiconductor circuit device, comprising:

a P-type semiconductor region;

an N-type semiconductor region surrounded at a bottom portion and at a peripheral portion thereof by said P-type semiconductor region;

a diffused resistor region formed of a P-type diffused region disposed on a surface of said N-type semiconductor region;

an insulating film covering said surface of said N-type semiconductor region and said diffused resistor region, said insulating film having a first contact hole which exposes a first end portion of said diffused resistor region, and a second contact hole which exposes a second end portion of said diffused resistor region;

a contact region of N-conductivity type disposed on said surface of said N-type semiconductor.region so as to surround said diffused resistor region and to be in contact with only said first end portion of said diffused resistor region, said contact region having a higher N-type impurity concentration than that of said N-type semiconductor region;

a first electrode film contacting both said first end portion of said diffused resistor region and said contact region through said first contact hole, for application of a high-potential thereto; and a second electrode film contacting said second end portion of said diffused resistor region through said second contact hole, for application of a low-potential.

15. The resistor according to claim 14, further comprising:

an N-type embedded region disposed between said bottom portion of said N-type semiconductor region and said P-type semiconductor region, said N-type embedded region having a higher impurity concentration than that of said N-type semiconductor region.

16. The resistor according to claim 14, wherein:

said semiconductor circuit device includes a comparator; and said diffused resistor is used as an input resistor for an input terminal of said comparator.

17. The resistor according to claim 1, wherein:

said semiconductor circuit device is subject to an environmental condition in which a temperature exceeds 100° C.

* * * * *